US012149398B2

(12) United States Patent
Singh et al.

(10) Patent No.: US 12,149,398 B2
(45) Date of Patent: Nov. 19, 2024

(54) SYSTEM AND METHODS FOR ACCURATELY SYNCHRONIZING AN EVENT MONITORING APPLICATION AND A CLOUD-BASED EVENT MONITORING SERVICE

(71) Applicant: Tyco Fire & Security GmbH, Neuhausen am Rheinfall (CH)

(72) Inventors: Jagdeep Singh, Lasalle (CA); David-Alexandre Bourbonnais, Candiac (CA); Maxime Fortin, La Prairie (CA)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 0 days.

(21) Appl. No.: 17/709,013

(22) Filed: Mar. 30, 2022

(65) Prior Publication Data
US 2022/0321396 A1      Oct. 6, 2022

Related U.S. Application Data

(60) Provisional application No. 63/168,004, filed on Mar. 30, 2021.

(51) Int. Cl.
*H04L 41/0604* (2022.01)
*G06F 9/54* (2006.01)
*H04L 41/0686* (2022.01)

(52) U.S. Cl.
CPC .......... *H04L 41/0622* (2013.01); *G06F 9/542* (2013.01); *G06F 9/546* (2013.01); *H04L 41/0686* (2013.01)

(58) Field of Classification Search
CPC .................. H04L 41/0622; H04L 41/0686
(Continued)

(56) References Cited

U.S. PATENT DOCUMENTS 7,903,903 B1 *   3/2011   Acker .................... H04N 5/268
                                                   382/284
8,504,008 B1 *   8/2013   Gossweiler, III ..........................
                                                   H04M 1/72415
                                                   455/420

(Continued)

FOREIGN PATENT DOCUMENTS

WO       2018160181 A1     9/2018

OTHER PUBLICATIONS

Merriam-Webster's Collegiate Dictionary 1173 (vt. def. 3) (10th ed. 1993) (Year: 1993).*

(Continued)

*Primary Examiner* — David P Zarka
(74) *Attorney, Agent, or Firm* — ARENTFOX SCHIFF LLP (57) ABSTRACT

Example implementations include a method, apparatus and computer-readable medium for synchronizing an event monitoring application with an event monitoring service, comprising receiving, from the event monitoring service, based on subscribing to a control panel, a current state of the control panel. In addition, the implementations further include receiving, based on the subscribing, a first event message from the control panel. Further, the implementations further include determining, in response to a conflict between the first event message and the current state of the control panel, an updated state of the control panel based on comparing a first attribute of the first event message to a second attribute of a second event message of the current state of the control panel. Additionally, the implementations further include displaying the updated state of the control panel.

17 Claims, 5 Drawing Sheets

(58) Field of Classification Search
USPC .......................................................... 709/223
See application file for complete search history.

(56) References Cited

U.S. PATENT DOCUMENTS

| | | | | |
|---|---|---|---|---|
| 9,514,641 | B2* | 12/2016 | Chen | G08C 23/04 |
| 10,573,168 | B1* | 2/2020 | Razak | G08B 29/185 |
| 10,665,070 | B1* | 5/2020 | Picardi | G08B 31/00 |
| 2003/0171969 | A1* | 9/2003 | Morin | G06F 16/2358 |
| | | | | 707/E17.005 |
| 2003/0233485 | A1 | 12/2003 | Khan | |
| 2005/0275876 | A1 | 12/2005 | McLean et al. | |
| 2006/0092840 | A1 | 5/2006 | Kwan et al. | |
| 2006/0294045 | A1 | 12/2006 | Suggs et al. | |
| 2007/0260777 | A1 | 11/2007 | Timpe et al. | |
| 2009/0248967 | A1* | 10/2009 | Sharma | G06F 9/44505 |
| | | | | 711/E12.002 |
| 2010/0332696 | A1 | 12/2010 | Muppirala et al. | |
| 2012/0047435 | A1* | 2/2012 | Holladay | H04N 21/485 |
| | | | | 715/716 |
| 2013/0147604 | A1 | 6/2013 | Jones, Jr. et al. | |
| 2013/0169817 | A1 | 7/2013 | Jones et al. | |
| 2014/0075446 | A1 | 3/2014 | Wang et al. | |
| 2014/0297393 | A1* | 10/2014 | Phillipps | G06Q 20/18 |
| | | | | 705/14.39 |
| 2014/0354430 | A1* | 12/2014 | Soldner | G08B 13/1895 |
| | | | | 340/555 |
| 2015/0242455 | A1* | 8/2015 | N. | G06F 16/248 |
| | | | | 707/755 |
| 2015/0254971 | A1* | 9/2015 | Okeefe | G08B 29/126 |
| | | | | 340/511 |
| 2015/0348399 | A1* | 12/2015 | Cree | G08B 29/145 |
| | | | | 715/740 |
| 2016/0117195 | A1 | 4/2016 | Wang | |
| 2016/0189491 | A1 | 6/2016 | Sloo et al. | |
| 2016/0294786 | A1 | 10/2016 | Marquez Mendoza et al. | |
| 2017/0205987 | A1* | 7/2017 | Martin | G06F 3/04886 |
| 2017/0213447 | A1* | 7/2017 | Horrocks | G08B 19/00 |
| 2017/0323020 | A1* | 11/2017 | Bosarge | G06F 16/951 |
| 2018/0068114 | A1* | 3/2018 | Matsuura | G06F 21/51 |
| 2019/0008248 | A1 | 1/2019 | Kovtun et al. | |
| 2019/0096202 | A1* | 3/2019 | Seelman | G08B 25/008 |
| 2019/0190978 | A1 | 6/2019 | Brown | |
| 2019/0250619 | A1 | 8/2019 | Gillett | |
| 2019/0272736 | A1 | 9/2019 | Trundle et al. | |
| 2020/0019287 | A1 | 1/2020 | Sahai et al. | |
| 2020/0302777 | A1* | 9/2020 | Nalukurthy | G08B 29/22 |
| 2022/0318079 | A1* | 10/2022 | Ivanov | H04L 41/0622 |

OTHER PUBLICATIONS

The American Heritage Dictionary of the English Language 1091 (3rd ed. 1992) (Year: 1992).*

Merriam-Webster's Collegiate Dictionary 1173 (n. def. 2) (10th ed. 1993) (Year: 1993).*

International Search Report and Written Opinion in PCT/US2022/071451, mailed Jul. 27, 2022, 13 pages.

* cited by examiner

SYSTEM AND METHODS FOR ACCURATELY SYNCHRONIZING AN EVENT MONITORING APPLICATION AND A CLOUD-BASED EVENT MONITORING SERVICE

CLAIM OF PRIORITY

The present application for patent claims priority to U.S. Provisional Application No. 63/168,004 entitled "CLOUD-BASED FIRE PANEL APPLICATION" filed Mar. 30, 2021, and assigned to the assignee hereof and hereby expressly incorporated by reference.

TECHNICAL FIELD

Aspects of the present disclosure relate generally to cloud based event monitoring, and more particularly, to systems and methods for synchronizing an event monitoring application with an event monitoring service.

BACKGROUND

Many event monitoring systems have employed cloud computing systems to gain the multitude of benefits provided by cloud computing. For example, some event monitoring system have gained scalability, reliability, performance, ease of deployment, and/or cost benefits by employing cloud services to collect event information from control panels located in a supervised premises and distribute the event information to remote user devices configured to monitor the status of the control panels. In some instances, configuring a user device to monitor a control panel requires performing a synchronization process between the user device and the cloud computing system. However, current synchronization processes risk propagating outdated status information when the control panel disseminates additional event information while the synchronization process is performed.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An example aspect includes a method for synchronizing an event monitoring application with an event monitoring service, comprising subscribing to a control panel managed the event monitoring service, the control panel configured to receive event information from one or more sensors in a physical location. The method further includes receiving, from the event monitoring service, based on the subscribing, a current state of the control panel. Additionally, the method further includes receiving, based on the subscribing, a first event message from the control panel. Additionally, the method further includes determining, in response to a conflict between the first event message and the current state of the control panel, an updated state of the control panel based on comparing a first attribute of the first event message to a second attribute of a second event message of the current state of the control panel. Additionally, the method further includes displaying the updated state of the control panel.

Another example aspect includes an apparatus for synchronizing an event monitoring application with an event monitoring service, comprising a memory and a processor communicatively coupled with the memory. The processor is configured to subscribe to a control panel managed the event monitoring service, the control panel configured to receive event information from one or more sensors in a physical location. The processor is further configured to receive, from the event monitoring service, based on the subscribing, a current state of the control panel. Additionally, the processor further configured to receive, based on the subscribing, a first event message from the control panel. Additionally, the processor further configured to determine, in response to a conflict between the first event message and the current state of the control panel, an updated state of the control panel based on comparing a first attribute of the first event message to a second attribute of a second event message of the current state of the control panel. Additionally, the processor further configured to display the updated state of the control panel.

Another example aspect includes an apparatus for synchronizing an event monitoring application with an event monitoring service, comprising means for subscribing to a control panel managed the event monitoring service, the control panel configured to receive event information from one or more sensors in a physical location. The apparatus further includes means for receiving, from the event monitoring service, based on the subscribing, a current state of the control panel. Additionally, the apparatus further includes means for receiving, based on the subscribing, a first event message from the control panel. Additionally, the apparatus further includes means for determining, in response to a conflict between the first event message and the current state of the control panel, an updated state of the control panel based on comparing a first attribute of the first event message to a second attribute of a second event message of the current state of the control panel. Additionally, the apparatus further includes means for displaying the updated state of the control panel.

Another example aspect includes a non-transitory computer-readable medium storing instructions for synchronizing an event monitoring application with an event monitoring service, wherein the instructions are executable by a processor to subscribe to a control panel managed the event monitoring service, the control panel configured to receive event information from one or more sensors in a physical location. The instructions are further executable to receive, from the event monitoring service, based on the subscribing, a current state of the control panel. Additionally, the instructions are further executable to receive, based on the subscribing, a first event message from the control panel. Additionally, the instructions are further executable to determine, in response to a conflict between the first event message and the current state of the control panel, an updated state of the control panel based on comparing a first attribute of the first event message to a second attribute of a second event message of the current state of the control panel. Additionally, the instructions are further executable to display the updated state of the control panel.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

This disclosure describes techniques for implementing an accurate process for synchronizing an event monitoring application with an event monitoring service. In particular, aspects of the present disclosure provide a client application configured to resolve conflicts arising during a synchronization process between the client application and a cloud computing platform configured to distribute event information. Accordingly, for example, a client application may subscribe to a control panel via a cloud computing platform, receive a current status of the control panel from the cloud computing platform and one or more event messages that conflict with the current status, and resolve the conflicts to determine correct status of the control panel, thereby improving the reliability and accuracy of cloud-based event monitoring systems.

Figure 1:
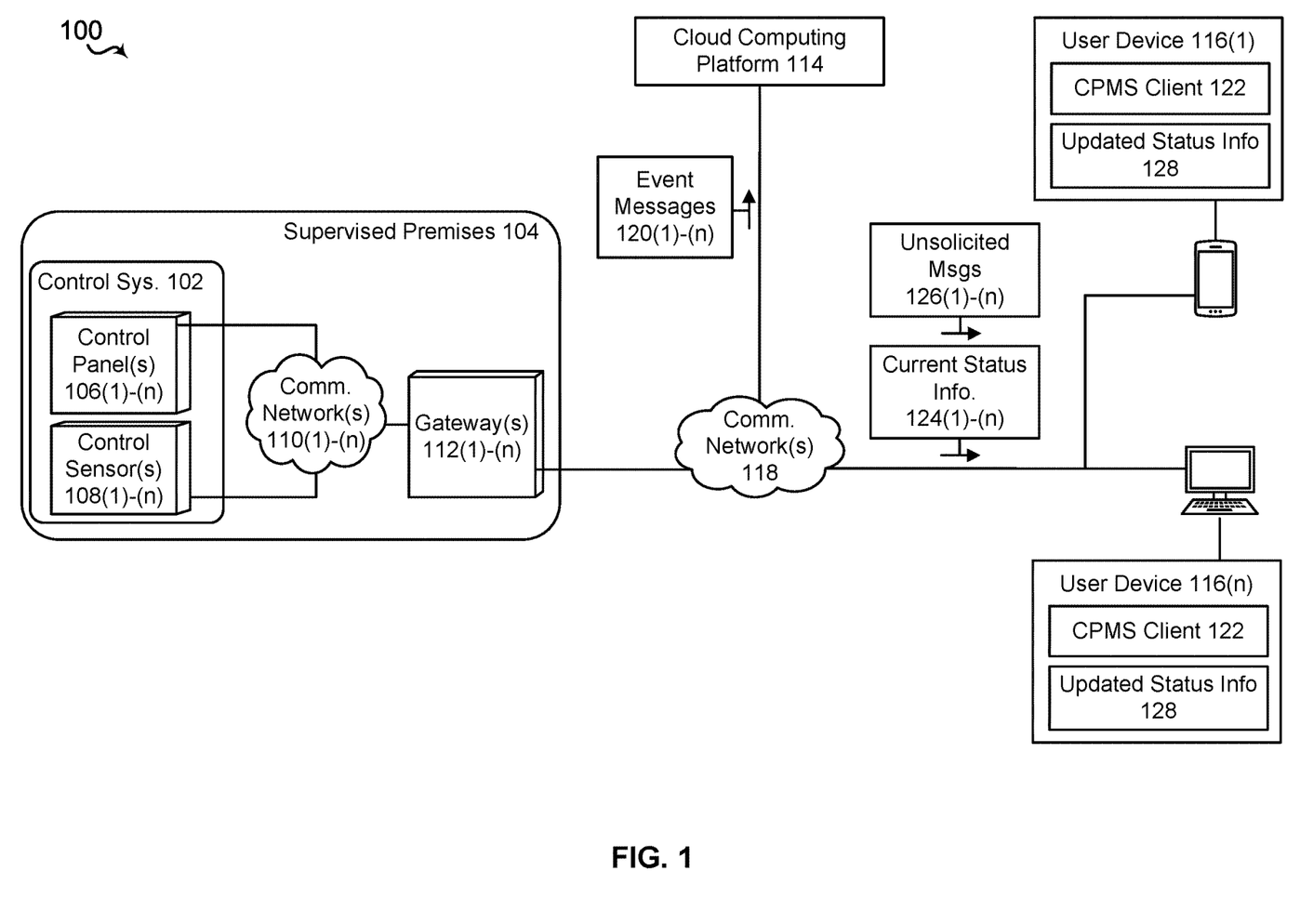
FIG. 1 is a diagram of an example of a cloud computing system for event monitoring, according to some implementations.

FIG. 1 is a diagram of an example of a control panel management system (CPMS) 100 for synchronizing an event monitoring application with an event monitoring service, according to some implementations. As illustrated in FIG. 1, a control panel management system (CPMS) 100 may include a control system 102 deployed within a supervised premises 104. Further, the control system 102 may include one or more control panels 106(1)-(n), one or more control sensors 108(1)-(n) deployed within the supervised premises 104, one or more communication networks 110(1)-(n), and one or more gateways 112(1)-(n). An example of a control sensor 108 may include a fire alarm and a corresponding example of a control panel 106 may include a fire panel configured to receive event information (e.g., smoke detected within a particular area of the supervised premises 104) from one or more fire alarms. Another example of a control sensor 108 may include a motion sensor and a corresponding example of a control panel is a security alarm panel configured to receive event information (e.g., motion detected within a particular area of the supervised premises) from one or more motion sensors. In some implementations, a communication network 110 may include a plain old telephone system (POTS), a radio network, a cellular network, an electrical power line communication system, one or more of a wired and/or wireless private network, personal area network, local area network, wide area network, and/or the Internet. Further, in some aspects, the control panels 106(1)-(n), the control sensors 108(1)-(n), and the gateways 112(1)-(n) may be configured to communicate via the communication networks 110(1)-(n).

In addition, the CPMS 100 may include a cloud computing platform 114, one or more user devices 116(1)-(n), and one or more communication networks 118(1)-(n). The communication network(s) 118 may comprise any one or combination of multiple different types of networks, such as cellular networks, wireless networks, local area networks (LANs), wide area networks (WANs), personal area networks (PANs), the Internet, or any other type of network configured to communicate information between computing devices (e.g., the cloud computing platform 114, the user devices 116(1)-(N), and the gateways 112(1)-(n)). Some examples of the user device 116 include smartphones and computing devices, Internet of Things (IoT) devices, video game systems, robots, process automation equipment, sensors, control devices, vehicles, transportation equipment, virtual and augmented reality (VR and AR) devices, industrial machines, etc.

Further, the cloud computing platform 114 may be configured to provide event messages 120(1)-(n) generated by the control system 102 to a CPMS client 122 of a user device 116 via the communication network 118. Consequently, a user of a user device 116 may be able to view of the state of the supervised premises via the CPMS client 122 based on the event messages 120(1)-(n) generated by the control panels 106(1)-(n). In some aspects, CPMS client 122 may be a mobile application, desktop application, or a web application. In some aspects, the CPMS client 122 may perform an initialization process with the cloud computing platform 114 to establish access by the CPMS client 122 to event messages 120 generated by one or more of the control panels 106(1)-(n).

During the initialization process between the CPMS client 122 and the cloud computing platform 114, the CPMS client 122 may connect to the cloud computing platform 114 and receive a list identifying one or more of the control panels 106 that the user device 116 is permitted to subscribe to. Further, in response to receipt of the list, the CPMS client 122 may send subscription information indicating the one or more control panels 106(1) that the user of the user device 116 is subscribing to. Upon receipt of the subscription information, the cloud computing platform 114 may generate a current status information 124 (i.e., a solicited message) indicating the current state of a control panel 106 that the CPMS client 122 is subscribing to, and transmit the current status information 124 to the CPMS client 122. In some aspects, the current status information 124 may include one or more the event messages 120 received from the control panel 106, and the one or more of the event messages 120 may representing the current state of the control panel 106, i.e., the state of one or more areas of the supervised premises monitored by control sensors 108 coupled with the control panel 106. Further, the cloud computing platform 114 may forward the plurality messages of the event messages 120 representing the current state of the control panel 106 to the CPMS client 122. In some instances, the cloud computing platform 114 may process (e.g., analyze, collate, filter, delete, and/or modify) the one or more of the event messages 120 representing the current state of the control panel before transmitting the one or more of the event messages 120 representing the current state of the control panel 106 to the CPMS client 122.

In some instances, as described herein, a CPMS client 122 may receive one or more unsolicited messages 126 from a control panel 106 during the initialization process. For example, the CPMS client 122 may endeavor to subscribe to a first control panel 106(1) during initialization process. As a result, the cloud computing platform 114 may generate the current status information 124(1) for the control panel 106(1) and transmit the current status information 124(1) to the CPMS client 122. However, as described with respect to FIG. 2, based on the CPMS client 122 subscribing to the control panel 106(1), the CPMS client 122 may also receive one or more event messages (i.e., the unsolicited messages 126) generated by the control panel 106(1) that are not in current status information 124(1). Further, the unsolicited messages 126 may conflict with the current status information 124(1). For instance, a message of the current status information 124(1) of the control panel 106(1) and an unsolicited message 126(1) generated by the control panel 106(1) may have the same event identifier but indicate different states for the event corresponding to the event identifier, e.g., the current status information 124(1) may indicate that event is closed while the unsolicited message 126(1) may indicate that the event is ongoing. As described with respect to FIG. 3, the CPMS client 122 may resolve the conflict to generate updated status information 128 instead of assuming the current status information 124(1) is the freshest status information. Further, the CPMS client 122 may resolve the conflict based on one or more attributes of the conflicting messages (e.g., timestamp and/or sequence number).

Figure 2:
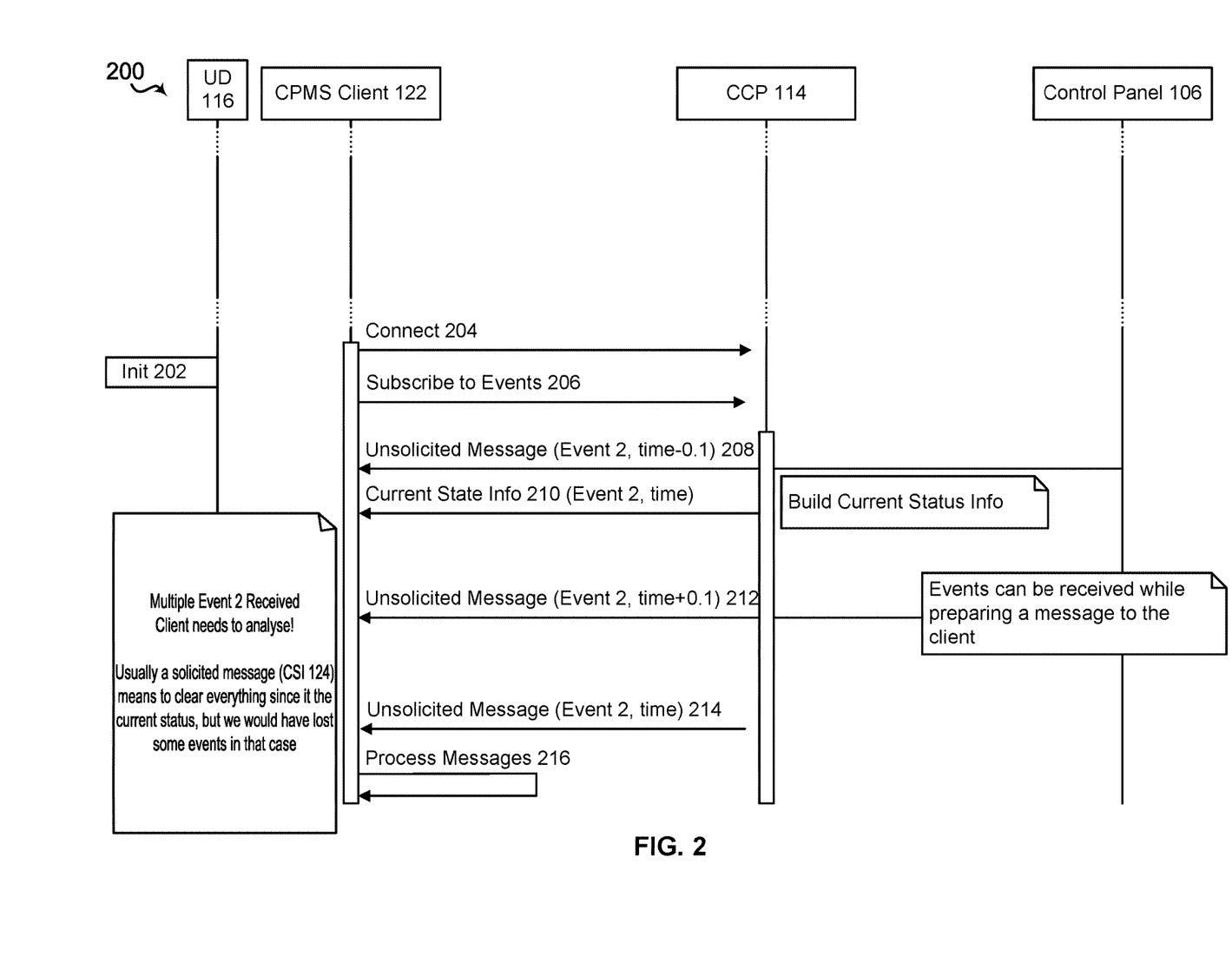
FIG. 2 is a flow diagram of an example of a method of initializing an event monitoring application, according to some implementations.

FIG. 2 is a flow diagram of an example of a method 200 of initializing an event monitoring application, according to some implementations. As illustrated in FIG. 2, a user device (UD) 116 may perform an initialization process 202 with cloud computing platform (CCP) 114. At step 204, a CPMS client 122 of the user device 116 may initiate a connection with the cloud computing platform 114. At step 206, the CPMS client 122 may subscribe to the events of a control panel 106(1) via the cloud computing platform 114. At step 208, the CPMS client 122 may receive a first unsolicited message 126(1) corresponding to an event (i.e., event 2) and having a first timestamp. At step 210, in response to the CPMS client 122 subscribing to the events of the control panel 106(1), the cloud computing platform 114 may generate current status information (CSI) 124(1) and transmit the current status information 124(1) to the CPMS client 122. Further, the current status information 124(1) may include a message corresponding to the event and include a second timestamp. At step 212, the CPMS client 122 may receive a second unsolicited message 126(2) corresponding to an event (i.e., event 2) and having a third timestamp, while cloud computing platform 114 was generating the CSI 124(1). Further, in some examples, due to processing time, the current state information 124(1) may not include the most recent information, therefore, the CPMS client 122 may be un-synchronized if the CPMS client 122 improperly discards a second unsolicited message 126(2). At step 214, the CPMS client 122 may receive a third unsolicited message 126(3) corresponding to an event (i.e., event 2) and having the second timestamp. In addition, at step 216, the initialization process 202 may end and the CPMS client 122 may process the messages received within the current status information 124(1) and the unsolicited messages 126(1)-(3). Further, the CPMS client 122 may determine that the unsolicited messages 126(1)-(3) received at steps 208, 212, and 214 conflict with the current status information 124(1) (i.e., the solicited message(s)) based on a message of the current status information. In response, the CPMS client 122 may compare one or more attributes of the messages to resolve the conflict. In some aspects, as described in detail with respect to FIG. 3, the CPMS client 122 may resolve the conflict based at least in part on the timestamps and/or the sequence numbers of the messages.

Figure 3:
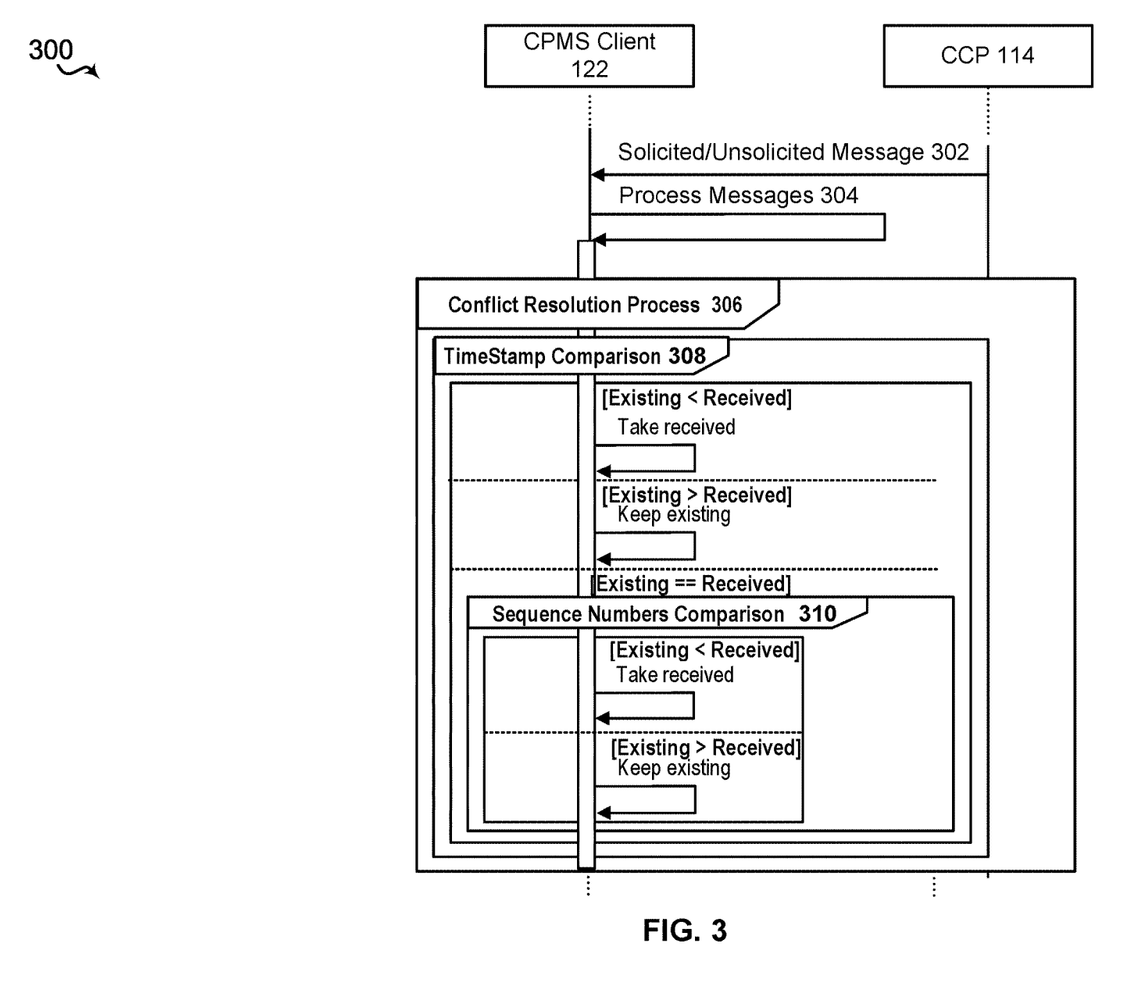
FIG. 3 is a flow diagram of an example of a method of resolving a conflict between two or more event messages received from a cloud computing service, according to some implementations.

FIG. 3 is a flow diagram of an example of a method of resolving a conflict between two or more messages received from a cloud computing service, according to some implementations. As illustrated in FIG. 3, at step 302, the CPMS client 122 may receive an unsolicited message 126(1) and a solicited message (e.g., a solicited message of the current status information 124(1) that conflict during an initialization process (e.g., the initialization process 206). At step 304, the CPMS client 122 may process the unsolicited message 126(1) and the solicited message of the current status information 124(1). At step 306, in order to resolve the conflict, the CPMS client 122 may perform a conflict resolution process. At step 308, the CPMS client 122 may perform a timestamp comparison of the two messages. If the timestamp of solicited message of the current status information 124(1) is more recent than the unsolicited message 126(1), the CPMS client 122 may dismiss the unsolicited message 126(1). If the timestamp of solicited message of the current status information 124(1) is less recent than the unsolicited message 126(1), the CPMS client 122 may generate updated status information 128 by replacing the solicited message with the unsolicited message 126(1) within the current status information 124(1). In some instances, the timestamps of the messages may be equal (e.g., the timestamps may be equal due to the imprecision of the timestamp), and the conflict resolution process may proceed to step 310. At step 310, the CPMS client 122 may compare sequence numbers assigned by the cloud computing platform 114 to the messages. If the sequence number of the solicited message of the current status information 124(10 is more recent than the unsolicited message 126(1), the CPMS client 122 may dismiss the unsolicited message 126(1). If the sequence number of the solicited message of the current status information 124(1) is less recent than the unsolicited message 126(1), the CPMS client 122 may generate updated status information 128 by replacing the solicited message with the unsolicited message 126(1) within the current status information 124(1). In some other embodiment, the CPMS client 122 may resolve the conflict the messages by comparing the sequence numbers without comparing the timestamps. As an example, with respect to FIG. 2, in some aspects, the unsolicited message 126(2) may have been used to generate the updated status information 128 and the other messages would have been discarded based on the timestamp of the unsolicited message 126(2). Further, in an example where the unsolicited message 126(3) is compared to a solicited message of the current status information 124(1), the CPMS client 122 may perform a sequence number comparison given that the unsolicited message 126(3) and the solicited message of the current status information 124(1) have the same timestamp. In some aspects, the cloud computing platform 114 assigns a sequence number to a message upon receipt or transmission of the message.

Figure 4:
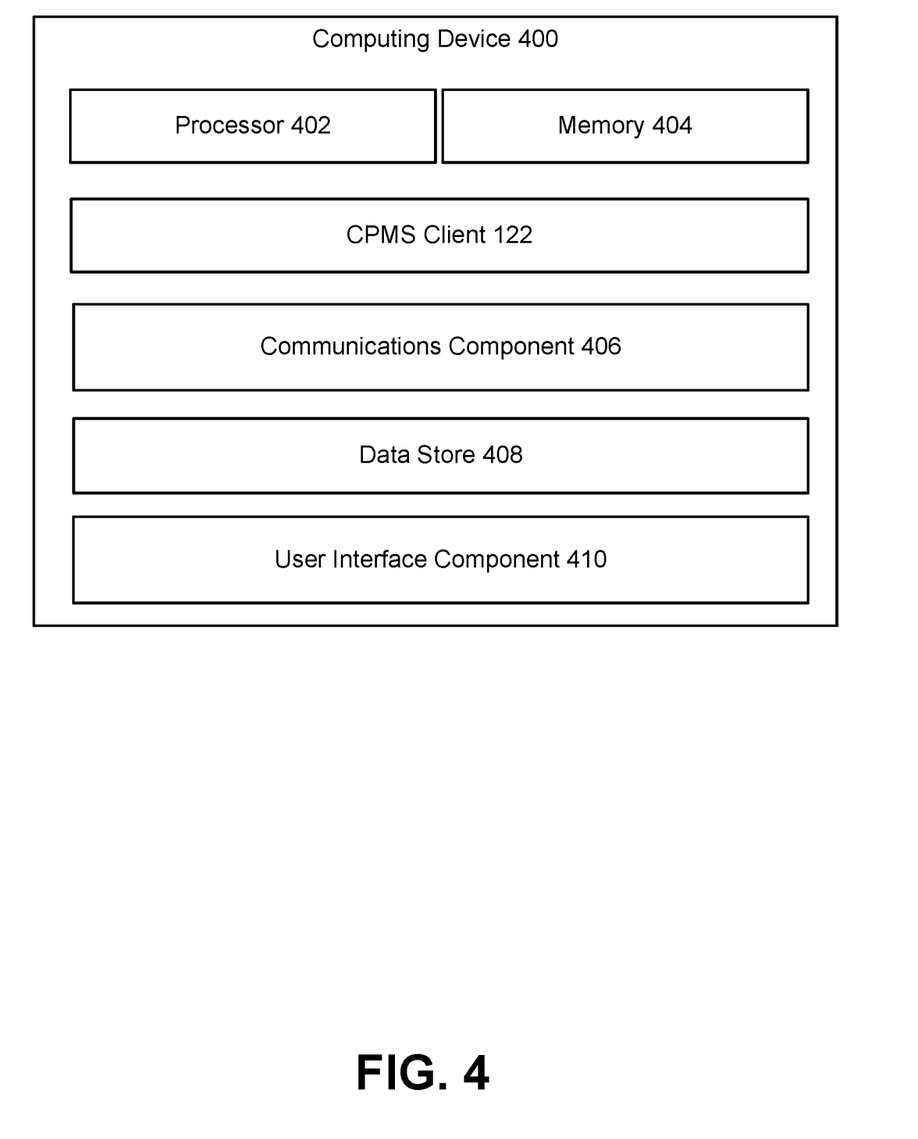
FIG. 4 is block diagram of an example of a computer device configured synchronize an event monitoring application with an event monitoring service, according to some implementations.

FIG. 4 is block diagram of an example of a computer device configured synchronize an event monitoring application with an event monitoring service, according to some implementations Referring to FIG. 4, a computing device 400 may implement all or a portion of the functionality described herein. The computing device 400 may be or may include or may be configured to implement the functionality of at least a portion of the system 100, or any component therein. For example, the computing device 400 may be or may include or may be configured to implement the functionality of the user device 116, the control panel 106, the cloud computing platform 114, or the control sensors 108(1)-(N). The computing device 400 includes a processor 402 which may be configured to execute or implement software, hardware, and/or firmware modules that perform any functionality described herein. For example, the processor 402 may be configured to execute or implement software, hardware, and/or firmware modules that perform any functionality described herein with reference to the CPMS client 122, or any other component/system/device described herein.

The processor 402 may be a micro-controller, an application-specific integrated circuit (ASIC), a digital signal processor (DSP), or a field-programmable gate array (FPGA), and/or may include a single or multiple set of processors or multi-core processors. Moreover, the processor 402 may be implemented as an integrated processing system and/or a distributed processing system. The computing device 400 may further include a memory 404, such as for storing local versions of applications being executed by the processor 402, related instructions, parameters, etc. The memory 404 may include a type of memory usable by a computer, such as random-access memory (RAM), read only memory (ROM), tapes, magnetic discs, optical discs, volatile memory, non-volatile memory, and any combination thereof. Additionally, the processor 402 and the memory 404 may include and execute an operating system executing on the processor 402, one or more applications, display drivers, etc., and/or other components of the computing device 400.

Further, the computing device 400 may include a communications component 406 that provides for establishing and maintaining communications with one or more other devices, parties, entities, etc. utilizing hardware, software, and services. The communications component 406 may carry communications between components on the computing device 400, as well as between the computing device 400 and external devices, such as devices located across a communications network and/or devices serially or locally connected to the computing device 400. In an aspect, for example, the communications component 406 may include one or more buses, and may further include transmit chain components and receive chain components associated with a wireless or wired transmitter and receiver, respectively, operable for interfacing with external devices.

Additionally, the computing device 400 may include a data store 408, which can be any suitable combination of hardware and/or software, that provides for mass storage of information, databases, and programs. For example, the data store 408 may be or may include a data repository for applications and/or related parameters not currently being executed by processor 402. In addition, the data store 408 may be a data repository for an operating system, application, display driver, etc., executing on the processor 402, and/or one or more other components of the computing device 400.

The computing device 400 may also include a user interface component 410 operable to receive inputs from a user of the computing device 400 and further operable to generate outputs for presentation to the user (e.g., via a display interface to a display device). The user interface component 410 may include one or more input devices, including but not limited to a keyboard, a number pad, a mouse, a touch-sensitive display, a navigation key, a function key, a microphone, a voice recognition component, or any other mechanism capable of receiving an input from a user, or any combination thereof. Further, the user interface component 410 may include one or more output devices, including but not limited to a display interface, a speaker, a haptic feedback mechanism, a printer, any other mechanism capable of presenting an output to a user, or any combination thereof.

Figure 5:
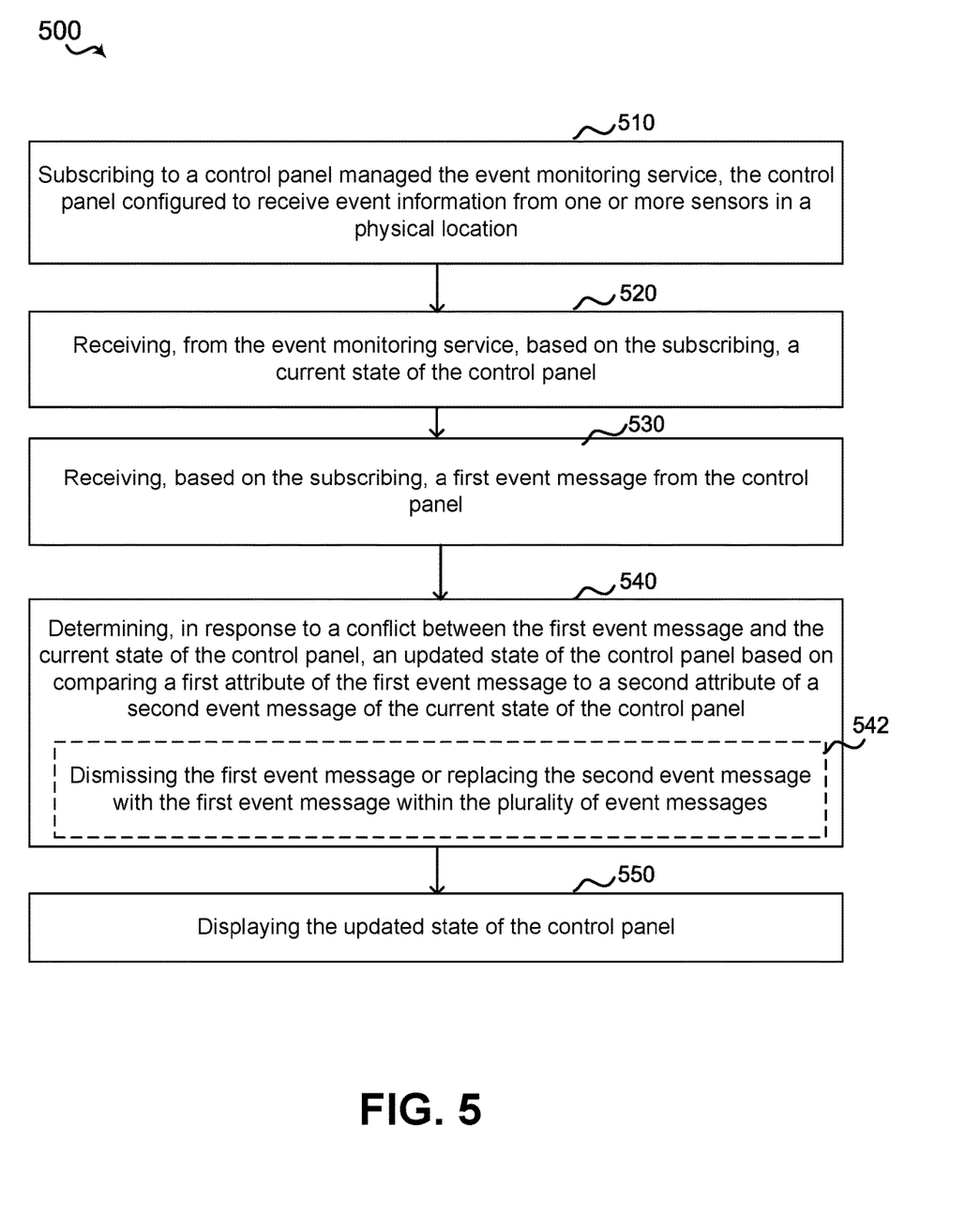
FIG. 5 is a flow diagram of an example of a method of synchronizing an event monitoring application with an event monitoring service, according to some implementations.

Referring to FIG. 4 and FIG. 5, in operation, computing device 400 may perform a method 500 of wireless communication, by such as via execution of CPMS client 122 by processor 402 and/or memory 404. FIG. 5 is a flow diagram of an example of the method 500 of synchronizing an event monitoring application with an event monitoring service, according to some implementations.

At block 510, the method 500 includes subscribing to a control panel managed the event monitoring service, the control panel configured to receive event information from one or more sensors in a physical location. For example, in an aspect, computing device 400, processor 402, memory 404, CPMS client 122, and/or user device 116 may be configured to or may comprise means for subscribing to a control panel managed the event monitoring service, the control panel configured to receive event information from one or more sensors in a physical location. For example, the subscribing at block 510 may include the CPMS client 122 receiving a list identifying one or more of the control panels 106 that the user device 116 is permitted to subscribe to, and sending subscription information indicating the one or more control panels 106(1) that the user of the user device 116 is subscribing to.

At block 520, the method 500 includes receiving, from the event monitoring service, based on the subscribing, a current state of the control panel. For example, in an aspect, computing device 400, processor 402, memory 404, CPMS client 122, and/or user device 116 may be configured to or may comprise means for receiving, from the event monitoring service, based on the subscribing, a current state of the control panel.

For example, the receiving at block 520 may include receiving the current status information 124 from the cloud computing platform 114. In some aspects, the current status information 124 may include one or more the event messages 120 received from the control panel 106, and the one or more of the event messages 120 may representing the current state of the control panel 106, i.e., the state of one or more areas of the supervised premises monitored by control sensors 108 coupled with the control panel 106. Further, for example, the receiving at block 520 may be performed as a part of a synchronization process between the CPMS client 122 and the cloud computing platform 114 to provide known state information of the control panel 106 to CPMS client 122 for presentation.

At block 530, the method 500 includes receiving, based on the subscribing, a first event message from the control panel. For example, in an aspect, computing device 400, processor 402, memory 404, CPMS client 122, and/or user device 116 may be configured to or may comprise means for receiving, based on the subscribing, a first event message from the control panel. For example, the receiving at block 530 may include receiving an unsolicited message 126(1) from the control panel 106 via the cloud computing platform 114.

At block 540, the method 500 includes determining, in response to a conflict between the first event message and the current state of the control panel, an updated state of the control panel based on comparing a first attribute of the first event message to a second attribute of a second event message of the current state of the control panel. For example, in an aspect, computing device 400, processor 402, memory 404, CPMS client 122, and/or user device 116 may be configured to or may comprise means for determining, in response to a conflict between the first event message and the current state of the control panel, an updated state of the control panel based on comparing a first attribute of the first event message to a second attribute of a second event message of the current state of the control panel. For example, the determining at block 540 may include determining that an unsolicited message 126 and a solicited message of the current status information 124 conflict based upon the unsolicited message 126 and the solicited message corresponding to the same event. Further, the CPMS client 122 may perform a conflict resolution process, as described with respect to FIG. 3, to generate updated status information 128. Further, for example, the determining at block 540 may be performed to ensure that the CPMS client 122 has fresh status information for the control panel 106 and does not no dismiss a relevant event message based on incorrectly assuming that the current status information 124 accurately represents the current state of the control panel 106.

At block 542, the determining the updated state of the control panel at block 540 of method 500 may further include dismissing the first event message or replacing the second event message with the first event message within the plurality of event messages. For example, in an aspect, computing device 400, processor 402, memory 404, CPMS client 122, and/or user device 116 may be configured to or may comprise means for dismissing the first event message or replacing the second event message with the first event message within the plurality of event messages. For example, the dismissing at block 542 may include a timestamp comparison or a sequence number comparison. In some aspects, if the timestamp of solicited message of the current status information is more recent than the unsolicited message, the CPMS client 122 may dismiss the unsolicited message. Further, if the timestamp of solicited message of the current status information is lower than the unsolicited message, the CPMS client 122 may generate updated status information by replacing the solicited message with the unsolicited message. In some other aspects, if the sequence number of the solicited message of the current status information is higher than the unsolicited message, the CPMS client 122 may dismiss the unsolicited message. Further, if the sequence number of the solicited message of the current status information is less recent than the unsolicited message, the CPMS client 122 may generate updated status information by replacing the solicited message with the unsolicited message.

At block 550, the method 500 includes displaying the updated state of the control panel. For example, in an aspect, computing device 400, processor 402, memory 404, CPMS client 122, and/or user device 116 may be configured to or may comprise means for displaying the updated state of the control panel. For example, the displaying at block 550 may include the CPMS client 122 displaying the updated status information 128 via a graphical user interface of the user device 116.

In an alternative or additional aspect of method 500, subscribing to the control panel comprises subscribing to the control panel during an initialization process with the event monitoring service.

In an alternative or additional aspect of method 500, determining the updated state of the control panel comprises identifying the conflict based at least in part on the first event message and the second event message having a common event identifier.

In an alternative or additional aspect of method 500, determining the updated state of the control panel comprises identifying a difference between a first state of the control panel indicated in the first event message and a second state of the control panel indicated in the second event message.

In an alternative or additional aspect of method 500, the first attribute is a first timestamp generated by the control panel in response to an occurrence of an event corresponding to the first event message and the second attribute is a second timestamp generated by the control panel in response to an occurrence of an event corresponding to the second event message.

In an alternative or additional aspect of method 500, the first attribute is a first sequence number generated by the event monitoring service in response to receipt of the first event message from the control panel and the second attribute is a second sequence number generated by the event monitoring service in response to receipt of the second event message from the control panel. In this aspect, determining the updated state of the control panel may include comparing the first sequence number to the second sequence number based on a first timestamp of the first event message being equal to a second timestamp of the second event message.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for synchronizing an event monitoring application with an event monitoring service, comprising:
    subscribing to receive a plurality of event messages from a control panel managed by the event monitoring service, the control panel configured to receive event information from one or more sensors in a physical location;
    receiving, from the event monitoring service, based on the subscribing to receive the plurality of event messages, a current state of the control panel;
    receiving, based on the subscribing to receive the plurality of event messages, a first event message from the control panel;
    determining, in response to a conflict between the first event message and the current state of the control panel, an updated state of the control panel based on comparing a first attribute of the first event message to a second attribute of a second event message of the current state of the control panel; and displaying the updated state of the control panel,
wherein the first attribute is a first sequence number generated by the event monitoring service in response to receipt of the first event message from the control panel and the second attribute is a second sequence number generated by the event monitoring service in response to receipt of the second event message from the control panel.

2. The method of claim 1, wherein the subscribing to the control panel comprises subscribing to the control panel during an initialization process with the event monitoring service.

3. The method of claim 1, wherein the plurality of event messages is a first plurality of event messages, the current state of the control panel includes a second plurality of event messages, and the determining the updated state of the control panel comprises:
dismissing the first event message or replacing the second event message with the first event message within the second plurality of event messages.

4. The method of claim 1, wherein the determining the updated state of the control panel comprises identifying the conflict based at least in part on the first event message and the second event message having a common event identifier.

5. The method of claim 1, wherein the determining the updated state of the control panel comprises identifying a difference between a first state of the control panel indicated in the first event message and a second state of the control panel indicated in the second event message.

6. The method of claim 1, wherein the first attribute further includes a first timestamp generated by the control panel in response to an occurrence of an event corresponding to the first event message and the second attribute further includes a second timestamp generated by the control panel in response to an occurrence of an event corresponding to the second event message.

7. The method of claim 1, wherein the determining the updated state of the control panel comprises comparing the first sequence number to the second sequence number based on a first timestamp of the first event message being equal to a second timestamp of the second event message.

8. An apparatus for synchronizing an event monitoring application with an event monitoring service, comprising:
a memory; and
a processor communicatively coupled with the memory and configured to:
subscribe to receive a plurality of event messages from a control panel managed by the event monitoring service, the control panel configured to receive event information from one or more sensors in a physical location;
receive, from the event monitoring service, based on the subscribing to receive the plurality of event messages, a current state of the control panel;
receive, based on the subscribing to receive a plurality of event messages, a first event message from the control panel;
determine, in response to a conflict between the first event message and the current state of the control panel, an updated state of the control panel based on comparing a first attribute of the first event message to a second attribute of a second event message of the current state of the control panel; and
display the updated state of the control panel,
wherein the first attribute is a first sequence number generated by the event monitoring service in response to receipt of the first event message from the control panel and the second attribute is a second sequence number generated by the event monitoring service in response to receipt of the second event message from the control panel.

9. The apparatus of claim 8, wherein to subscribe to the control panel comprises to subscribe to the control panel during an initialization process with the event monitoring service.

10. The apparatus of claim 8, wherein the plurality of event messages is a first plurality of event messages, the current state of the control panel includes a plurality of event messages, and to determine the updated state of the control panel comprises to:
dismiss the first event message or replacing the second event message with the first event message within the second plurality of event messages.

11. The apparatus of claim 8, wherein to determine the updated state of the control panel comprises to identify the conflict based at least in part on the first event message and the second event message having a common event identifier.

12. The apparatus of claim 8, wherein to determine the updated state of the control panel comprises to identify a difference between a first state of the control panel indicated in the first event message and a second state of the control panel indicated in the second event message.

13. The apparatus of claim 8, wherein the first attribute further includes a first timestamp generated by the control panel in response to an occurrence of an event corresponding to the first event message and the second attribute further includes a second timestamp generated by the control panel in response to an occurrence of an event corresponding to the second event message.

14. The apparatus of claim 8, wherein to determine the updated state of the control panel comprises comparing the first sequence number to the second sequence number based on a first timestamp of the first event message being equal to a second timestamp of the second event message.

15. A non-transitory computer-readable medium storing instructions for synchronizing an event monitoring application with an event monitoring service, wherein the instructions are executable by a processor to:
subscribe to receive a plurality of event messages from a control panel managed by the event monitoring service, the control panel configured to receive event information from one or more sensors in a physical location;
receive, from the event monitoring service, based on the subscribing to receive the plurality of event messages, a current state of the control panel;
receive, based on being subscribed to receive a plurality of event messages from the control panel, a first event message from the control panel;
determine, in response to a conflict between the first event message and the current state of the control panel, an updated state of the control panel based on comparing a first attribute of the first event message to a second attribute of a second event message of the current state of the control panel; and
display the updated state of the control panel,
wherein the first attribute is a first sequence number generated by the event monitoring service in response to receipt of the first event message from the control panel and the second attribute is a second sequence number generated by the event monitoring service in response to receipt of the second event message from the control panel.

16. The non-transitory computer-readable medium of claim 15, wherein the first attribute further includes a first timestamp generated by the control panel in response to an occurrence of an event corresponding to the first event message and the second attribute further includes a second timestamp generated by the control panel in response to an occurrence of an event corresponding to the second event message.

17. The non-transitory computer-readable medium of claim 15, wherein the determining the updated state of the control panel comprises comparing the first sequence number to the second sequence number based on a first timestamp of the first event message being equal to a second timestamp of the second event message.

* * * * *